United States Patent [19]
Frankel

[11] Patent Number: 6,100,831
[45] Date of Patent: Aug. 8, 2000

[54] OPTOELECTRONIC ANALOG-TO-DIGITAL CONVERTER USING WAVELENGTH DIVISION MULTIPLEXING

[75] Inventor: Michael Y. Frankel, Crofton, Md.

[73] Assignee: The United States of America as represented by the Secretary of the Navy, Washington, D.C.

[21] Appl. No.: 09/106,460

[22] Filed: Jun. 30, 1998

[51] Int. Cl.⁷ .................................................. H03M 1/00
[52] U.S. Cl. ........................ 341/137; 359/123; 359/181
[58] Field of Search .................................. 341/137, 111; 359/124, 125, 123, 181, 184, 173, 188, 121; 385/24, 37, 40

[56] References Cited

U.S. PATENT DOCUMENTS

| | | | |
|---|---|---|---|
| 4,325,603 | 4/1982 | Marom | 385/40 |
| 4,502,037 | 2/1985 | Le Parquier et al. | 341/111 |
| 4,928,007 | 5/1990 | Furstenau et al. | 341/137 |
| 5,010,346 | 4/1991 | Hamilton et al. | 341/137 |
| 5,450,223 | 9/1995 | Wagner et al. | 359/124 |
| 5,589,969 | 12/1996 | Taga et al. | 359/124 |
| 5,710,649 | 1/1998 | Mollenauer | 359/123 |
| 5,828,474 | 10/1998 | Prucnal et al. | 359/123 |

Primary Examiner—Brian Young
Assistant Examiner—Patrick Wamsley
Attorney, Agent, or Firm—Thomas E. McDonnell; George Jameson

[57] ABSTRACT

An optoelectronic system is provided for converting analog electrical signals into digital electrical signals. An optical carrier produced by a laser source is separated into spectral components. An electro-optical modulator modulates the optical carrier with a radio frequency input signal so as to produce an amplitude modulated optical output signal. The optical output signal is then outputted to a wavelength division demultiplexer which separates the output signal into a plurality of separate channels, based on wavelength. Photodetectors connected to each of the channels convert the separated signals into analog electrical signals. These analog electrical signals are outputted to a plurality of standard analog to digital converters which convert the analog electrical signals into digital signals.

11 Claims, 4 Drawing Sheets

OPTOELECTRONIC ANALOG-TO-DIGITAL CONVERTER USING WAVELENGTH DIVISION MULTIPLEXING

BACKGROUND OF THE INVENTION

1. Field of the Invention

The present invention relates to devices used to convert analog electrical signals to digital electrical signals.

2. Related Art

Analog-to-digital (A–D) converters are used in test and data acquisition instruments. State of the art A–D converters based on III–V semiconductors provide eight bit resolution at 2 GHz and three bit resolution at 8 GHz. State of the art silicon based A–D converters operate at 500 MHZ with seven bits of resolution. Because of the limited bandwidth and sampling rates of electronic A–D converters, some optical devices, have in some instances, been incorporated into A–D converters in an attempt to increase the bandwidth and sampling rate.

In U.S. Pat. No. 5,010,345, to Hamilton et al., an electro-optical A–D converter is disclosed which uses a series of separate lasers having different wavelengths as an optical carrier. It will be appreciated that it is difficult to synchronize the timing and amplitude of these laser beams and that the resulting jitter between the channels limits the sampling rate and amplitude resolution. Moreover, the number of channels such an electro-optical A–D converter can use appears to be limited to about ten. A device with more channels would have a higher bandwidth and sampling rate.

SUMMARY OF THE INVENTION

According to the invention, there is provided an analog-to-digital converter for digitizing analog electrical signals while affording bandwidth and dynamic range characteristics which cannot be achieved with prior art converters. Unlike the converter disclosed in U.S. Pat. No. 5,010,345, the converter architecture of the present invention allows for the use of more than 100 channels, which results in a dynamic range greater than 6 bits at 10 GHz sampling. Furthermore, the converter architecture provides a "remoting" capability wherein the input stage is located near the signal source while the digitizing and signal processing stages described below are remotely located. Among the advantages of this "remoting" feature is that the digitizing and signal processing stages can be positioned at the remote location where space and power is available while minimizing the size and weight of the components located at the signal source.

In accordance with a first embodiment of the invention, an analog-to-digital converter system is provided which comprises: a pulsed laser source for producing laser pulses which have a predetermined wavelength band, which have a pulse duration on the order of picoseconds and which define an inter-pulse period therebetween; an optical pulse processing means for providing one-to-one mapping of spectral components of the wavelength band onto time components over the inter-pulse period so as to thereby create a quasi-continuous optical carrier; an electro-optical modulator for modulating the optical carrier with a radio frequency input signal so as to produce an amplitude modulated optical output signal; a wavelength division demultiplexer, having an input and a plurality of outputs, for receiving the modulated optical output signal at the input and for separating, based on wavelength, the modulated optical output signal into a plurality of separate channels at the outputs thereof so as to produce a like plurality of separated signals; a like plurality of photodetectors, each connected to one of the outputs of the demultiplexer, for converting the separated signals into a like plurality of analog electrical signals; and a like plurality of analog to digital converters for converting the analog electrical signals into digital signals.

In a preferred embodiment, the optical pulse processing means includes a highly dispersive optical fiber link connected between the laser source and the modulator. Advantageously, the highly dispersive optical fiber link maps the spectral components of the wavelength band into continuous time components over the inter-pulse period such that the optical power of the quasi-continuous optical carrier is substantially constant during each inter-pulse period.

Advantageously, the system includes an optical amplifier connected between the laser source and the electro-optical modulator at the input of the electro-optical modulator.

The system preferably includes a trigger means associated with the laser source for controlling triggering of the analog-to-digital converters.

The system also preferably includes an amplitude noise reduction means connected to the electro-optical modulator for adjusting a bias voltage of the electro-optical modulator based on optical power changes of the optical carrier.

In accordance with a second embodiment of the invention, an optical pulse processing means converts each of the pulses produced by the laser source into a series of narrower bandwidth pulses having different wavelength bands. In this embodiment, the optical carrier consists of the narrower bandwidth pulses.

In one preferred implementation of this embodiment, the pulse processing means includes a wavelength demultiplexer having an input for receiving the pulses and a plurality of outputs; a plurality of optical fiber links each connected to one of the outputs of the demultiplexer, the optical fiber links being of different lengths; and a multiplexer having a plurality of inputs each connected to one of the optical fiber links and an output connected to the electro-optical modulator.

In another preferred implementation of this embodiment, the pulse processing means includes a polarization beam splitter having an input terminal connected to an output of the laser source, an output/input terminal and an output terminal connected to the electro-optical modulator; a wavelength demultiplexer having an input/output terminal connected to the output/input terminal of the beam splitter and a plurality of outputs; a plurality of optical fiber links connected between respective outputs of the demultiplexer and a plurality of Faraday rotator mirrors; and wherein the plurality of Faraday rotator mirrors rotate the polarization and reflect signals received thereby, the optical fiber links being of different lengths, and signal polarization rotated and reflected by the Faraday rotator mirrors being returned to the polarization beam splitter through the wavelength demultiplexer and outputted at the output terminal of the polarization beam splitter to the electro-optical modulator.

Other features and advantages of the invention will be set forth in, or apparent from, the following detailed description of the preferred embodiments of the invention.

DESCRIPTION OF THE PREFERRED EMBODIMENTS

Figure 1:
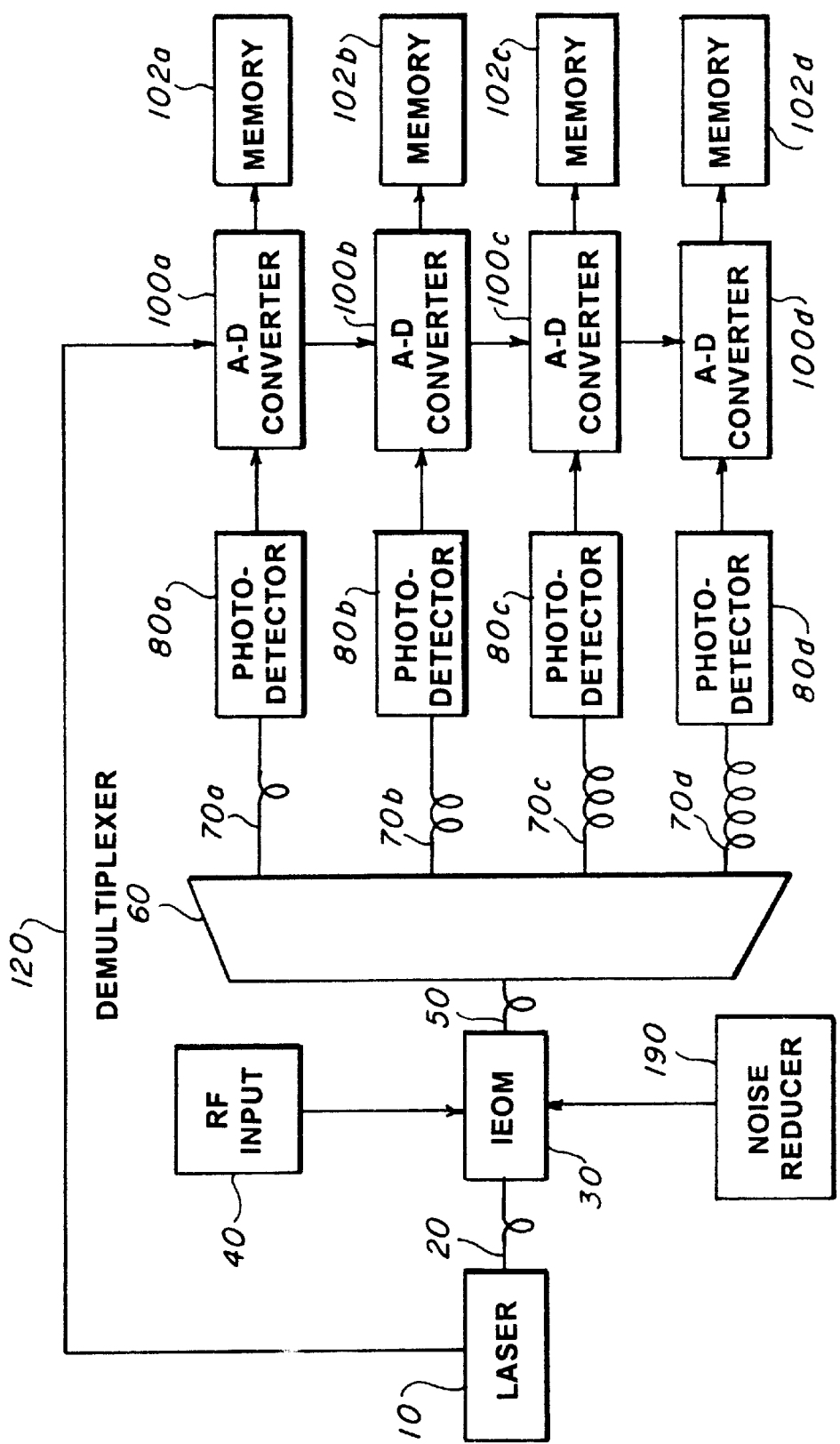
FIG. 1 is a schematic block diagram of an optoelectronic analog-to-digital converter system in accordance with a first preferred embodiment of the invention.

Referring to FIG. 1, there is shown an optoelectronic analog-to-digital (A–D) converter system in accordance with a first preferred embodiment of the invention. Briefly considering the overall A–D converter system in this embodiment, an ultrashort pulsed laser source 10 produces a series of optical pulses of very short duration as discussed below. The pulse output of the laser source 10 propagates through a highly dispersive optical fiber 20. The dispersive optical fiber 20 is connected to an integrated electro-optic modulator (IEOM) 30 which also has an RF input 40. It will be appreciated that the analog signal at the RF input 40 is the signal to be converted into a corresponding digital signal. IEOM modulates the optical signal received over optical fiber 20 with the RF signal at RF input 40 to produce a modulated optical output signal. The output signal produced by the IEOM 30 travels through an optical fiber 50 to the input of a wavelength division demultiplexer 60. The wavelength division demultiplexer 60 has a plurality of outputs and divides the output signal produced by IEOM 30 into a plurality of different wavelength bands so that signals in these different bands are produced at the different outputs. These outputs are connected by optical fiber bundles 70a–70d to a plurality of photodetectors 80a–80d which receive the optical signals carried by fiber bundles 70a–70d and output corresponding electrical signals to a like plurality of conventional A–D converters 100a–100d. A–D converters 100a–100d produce electrical data bits which are stored by slow, conventional memories 102a–102d connected to the respective A–D converters 100a–100d.

Figure 2A:
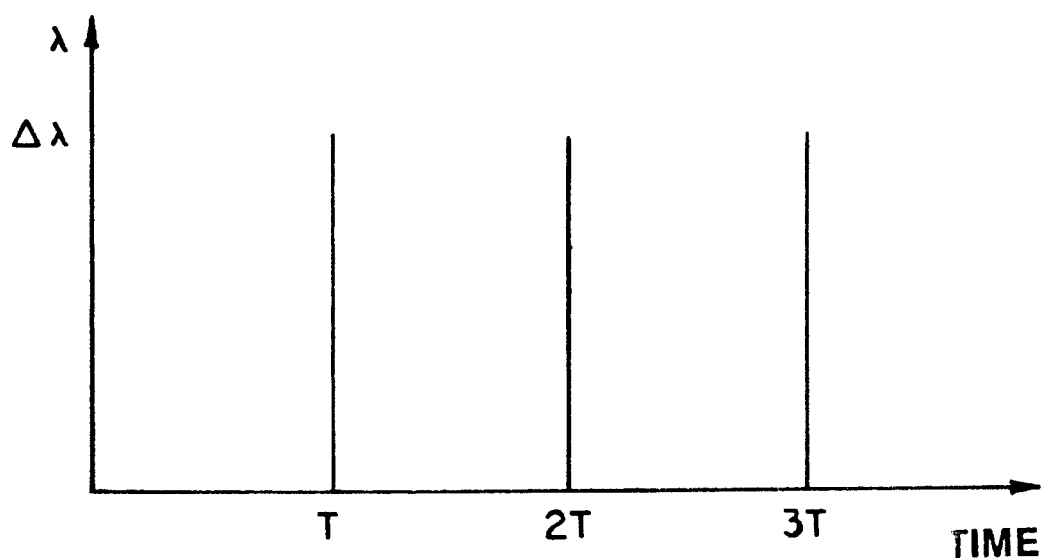
FIG. 2(a) is a wavelength-time characteristic diagram for the laser pulses used in the embodiment of FIG. 1.

Considering some of the individual units or devices of the A–D converter system of FIG. 1 in more detail, the laser source 10 produces a series of short pulses at a regular interval T. The pulses preferably have a duration in the subpicosecond range and a bandwidth of several nanometers. The repetition rate of the pulses must be as slow or slower than the maximum sampling rate of the conventional A–D converters 100a–100d. Since the pulse duration is short, all of the spectral components of the pulse overlap in time. FIG. 2(a) shows the wavelength-time characteristics for a series of three pulses produced by the laser source 10.

The pulse jitter of laser source 10 degrades the measurement performance of the A–D converter by introducing time uncertainties which limit the dynamic range of the A–D converter. Commercial laser sources have a typical pulse jitter of the order of $\tau_{jitter}$~1 ps.

The equivalent worst-case number of resolvable bits N is computed from:

$$N = -\log_2\left(\pi \frac{f_{max}}{2} \tau_{jitter}\right)$$

Figure 2B:
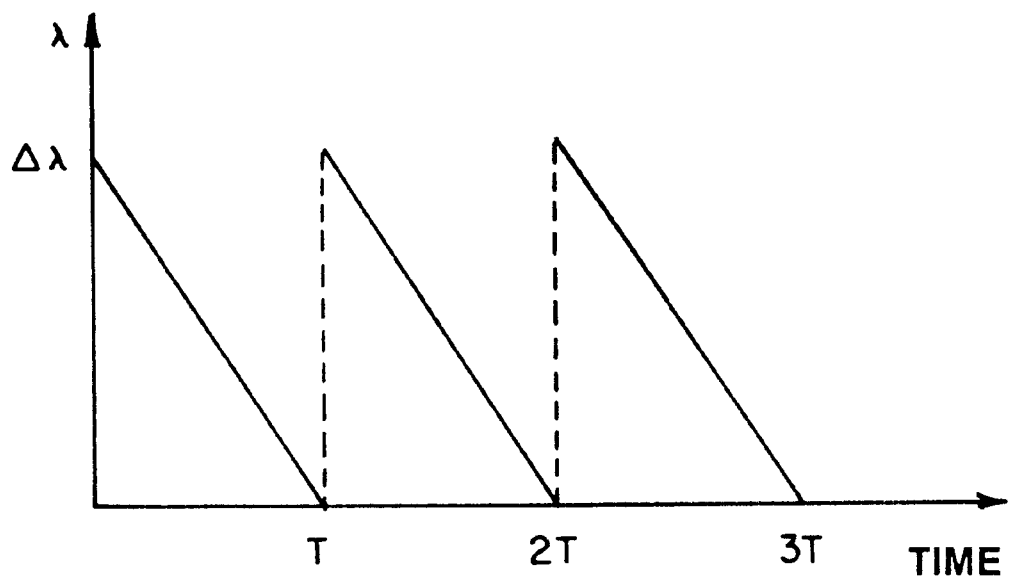
FIG. 2(b) is a wavelength-time characteristic diagram for the laser pulses after traveling through the dispersive optical fiber employed in the embodiment of FIG. 1.
Figure 3A:
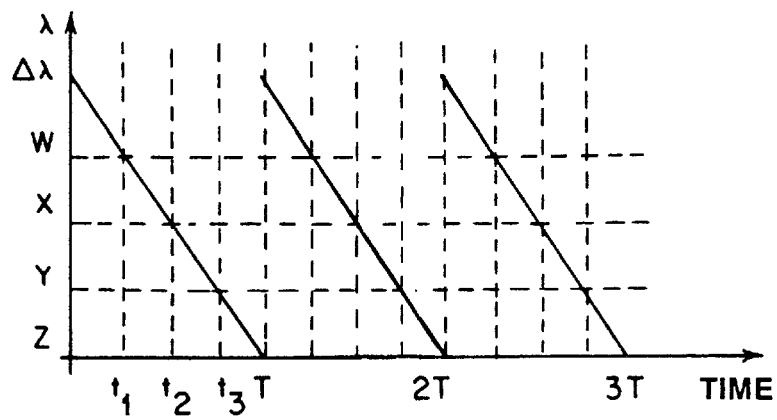
FIG. 3(a) is a wavelength-time characteristic diagram showing the different wavelength bands provided in accordance with the embodiment of FIG. 1.
Figure 3B:
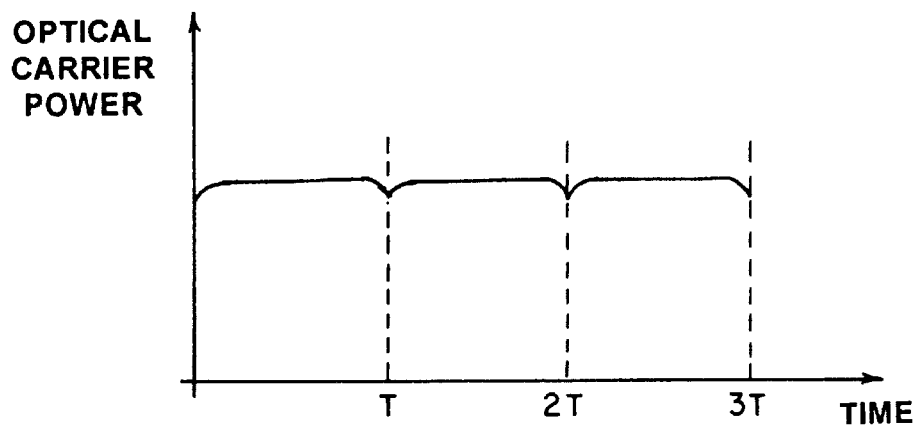
FIG. 3(b) is an optical power-time characteristic diagram showing the average power of optical carrier used in the embodiment of FIG. 1.

The highly dispersive optical fiber 20 allows different wavelengths to travel therealong at different speeds. This characteristic allows the dispersive optical fiber 20 to chirp or stretch the pulses so as to perform a one to one mapping between wavelength and time for each laser pulse. The output of the dispersive optical fiber 20 is shown in FIG. 2(b). As illustrated in FIG. 2(b), each wavelength of the optical pulse is mapped to a unique time period in interval T. The length and dispersion factor of the dispersive optical fiber 20 are chosen such that the entire wavelength band of the pulses produced by laser source 10 are mapped to time over the entire interval T. The dispersive optical fiber 20 thus transforms the series of short pulses from the laser 10 into a quasi-continuous optical carrier having an average optical power which is essentially flat, i.e., constant, as shown in FIG. 3(b).

Figure 3C:
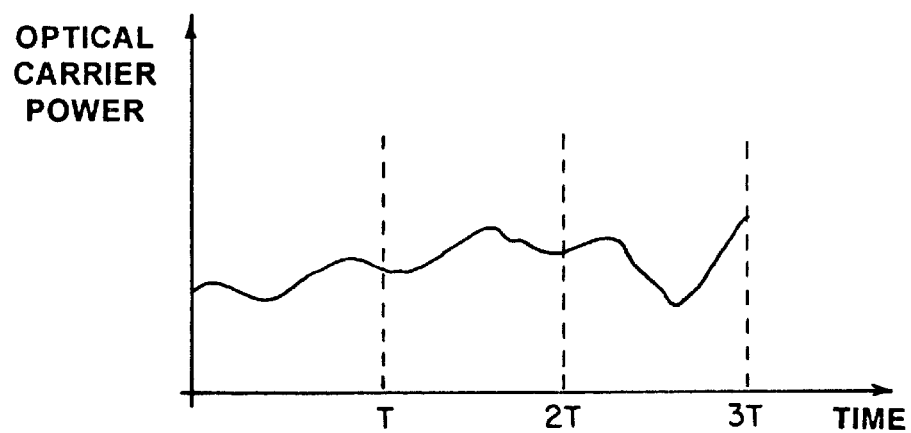
FIG. 3(c) is an optical power-time characteristic diagram showing the power of the optical signal used in the embodiment of FIG. 1.

As set forth above, RF input 40 supplies the IEOM 30 with the analog electrical signal to be converted. The optical transmission of the IEOM 30 is a function of the voltage level of the RF input 40. Therefore, the quasi-continuous optical carrier from the dispersive optical fiber 20 is transformed into an amplitude modulated optical signal by the IEOM 30 such as shown in FIG. 3(c). In a preferred embodiment, a feed forward noise reducer 190 applies a DC bias voltage to the IEOM 30. The DC bias voltage compensates for changes in the optical power of the quasi-continuous optical carrier and thus ensures that a substantially constant average optical power is maintained as shown in FIG. 3(b).

The amplitude modulated optical signal produced by the IEOM 30 travels through optical fiber 50 to the wavelength division multiplexer 60. The use of optical fiber 50 allows the conventional A–D converters 100a–100d and processing stages to be placed at a distance from the RF input 40 were they can be protected and cooled.

As noted above, the wavelength division multiplexer 60 separates the amplitude modulated optical signal into a series of channels based on wavelength bands. Although FIG. 1 shows a wavelength division demultiplexer 60 having four channels, it will be appreciated that this is for illustrative purposes only and that the actual device can have many more channels. Referring to FIG. 3(a) the output of the dispersive optical fiber 20 is shown as being divided into four equal wavelength bands, denoted W, X, Y and Z, for every interval T. Of course, the number of wavelength bands corresponds to the number of output channels of the wavelength division multiplexer 60. During interval $t_1$ in FIG. 3(a), the IEOM 30 modulates the portion of the laser output signal in bandwidth W. The wavelength division multiplexer 60 outputs the modulated optical signals in bandwidth W over optical fiber 70a. During interval $t_2$, the IEOM 30 modulates the portion of the laser output signal in bandwidth X and the wavelength division multiplexer 60 outputs the modulated optical signals in bandwidth B over optical fiber 70b. This basic operation is repeated for the remaining wavelength bands Y and Z.

The required bandwidth $\lambda_{pass}$ of the wavelength division multiplexer 60 necessary to achieve the full bandwidth capability is computed from:

This formula results in a $\lambda_{pass}$~0.18 nm for a 10 GHz input signal. The wavelength $$\lambda_{pass} = \sqrt{\frac{2\lambda_0^2}{c}\frac{\Delta\lambda}{T}}$$

division demultiplexer 60 may have a number of channels= $\Delta\lambda/\lambda_{pass}$, where $\Delta\lambda$ is the spectral bandwidth of the optical source. Using this formula with $\Delta\lambda$=20 nm, the number of channels available for a 10 GHz input signal=111.

As set forth above, optical fibers 70a–70d connect demultiplexer 60 to photodetectors 80a–80d. The individual lengths of optical fibers 70a–70d are chosen such that the outputs of the optical fibers 70a–70b arrive at photodetectors 80a–80d at the same time.

As discussed above, the photodetectors 80a–80d convert the optical output signals from optical fibers 70a–70b into electrical signals 90a–90d (not shown) which are supplied to the conventional electrical A–D converters 100a–100d. A trigger signal 120 from the laser source 10 activates the A–D converters 100a–100d. The A–D converters 100a–100d operate in parallel and only need to have a maximum sampling rate which allows the converters to digitize an electrical signal in interval T. The overall sampling frequency of the optoelectronic A–D converter system of FIG. 1 is equal to the sampling frequency of the conventional A–D converters 100a–100d when multiplied by the number of channels.

The bandwidth of the optoelectronic A–D converter system is limited by spectral broadening created by the analog signal at RF input 40 which causes the signal from one interval t to spill over into another interval. The limit $f_{max}$ is calculated from:

$$f_{max} = \sqrt{\frac{c}{2\lambda_0^2}\frac{\Delta\lambda}{T}}$$

Typical commercially available lasers have a $\lambda_0$=1550 nm, $\Delta\lambda$=20 nm and T=10 ns. With these parameters, the maximum signal sampling frequency $f_{max}$~10 GHz. Improving the laser parameters to $\lambda_0$=1550 nm, $\Delta\lambda$=50 nm and T=10 ns results in a maximum signal sampling frequency $f_{max}$~40 GHz.

Figure 4:
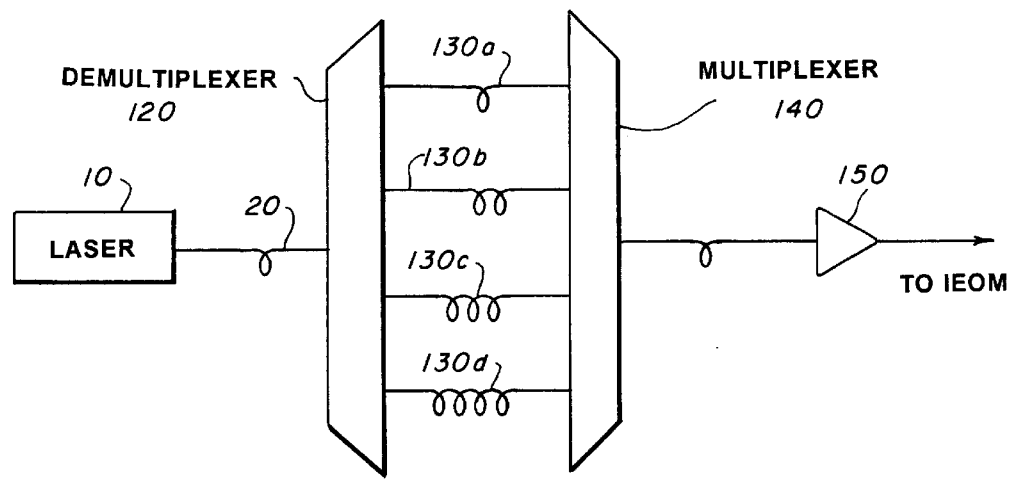
FIG. 4 is a schematic view of the front end of an optoelectronic analog-to-digital converter system in accordance with a further preferred embodiment of the invention.

An alternative embodiment of the invention is shown in FIG. 4 which shows the front end of the system. In this embodiment, laser source 10 sends laser pulses through optical fiber 20 to a wavelength division demultiplexer 120. The wavelength division demultiplexer 120 separates the spectral components into separate channels. Optical fibers 130a–130d connect the wavelength division demultiplexer 120 to a wavelength division multiplexer 140. As indicated schematically in FIG. 4, the optical fibers 130a–130d have different lengths so that the signals having different wavelength bands arrive at the wavelength division multiplexer 140 at different times. The wavelength division multiplexer 140 then converts the input signals into a single stream of pulses having four different wavelength bands. The wavelength division demultiplexer 120 and wavelength division multiplexer 140 have the same number of channels as the wavelength division demultiplexer 60, shown in FIG. 1. The clock frequency of the wavelength division multiplexer 140 is equal to the frequency of the pulses leaving the laser source 10 multiplied by the number of channels in the wavelength division multiplexer 140.

The optical pulses produced by the wavelength division multiplexer 140 pass through an optical amplifier 150 before being applied to the IEOM 30, shown in FIG. 1. The remainder of the system is the same as that of FIG. 1 and the optical signals produced by the IEOM 30 are processed in the same manner as are the signals produced by the IEOM 30 in the optoelectronic A–D converter system shown in FIG. 1.

Figure 5:
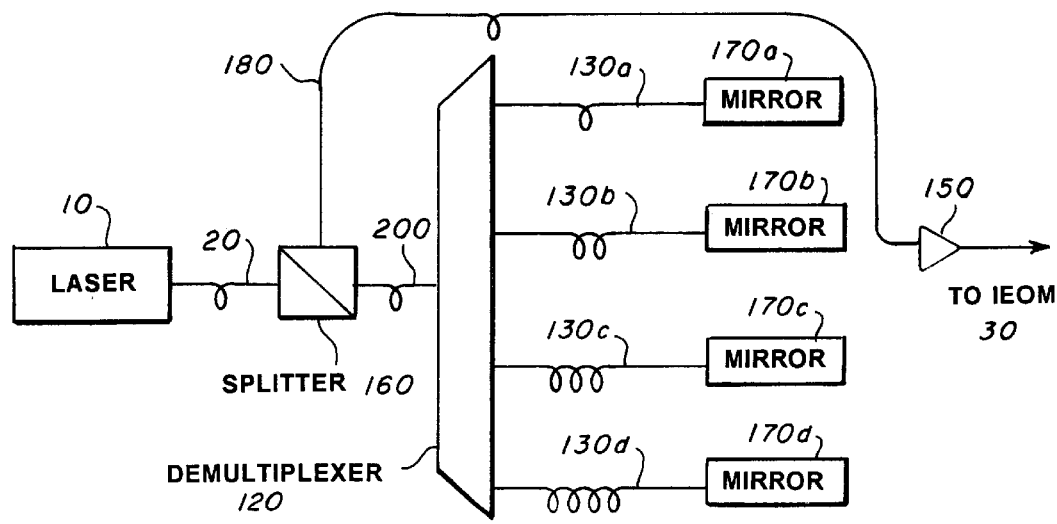
FIG. 5 is a schematic view of the front end of an optoelectronic analog-to-digital converter system in accordance with another preferred embodiment of the invention.

FIG. 5 shows another alternative embodiment of the invention. Again, only the front end is shown because the remainder of the system is the same as that of FIG. 1. In FIG. 5, a laser source 10 sends laser pulses through an optical fiber 20 to a polarizing beam splitter 160. The polarized laser beam then travels through optical fiber 200 to wavelength division demultiplexer 120. Optical fibers 130a–130d connect the wavelength division demultiplexer 120 to Faraday rotator mirrors 170a–170d. The Faraday rotator mirrors 170a–170d rotate the plane of polarization of the optical pulses from the optical fibers 130a–130d by 90°. The optical pulses then pass back through the wavelength division demultiplexer 120 to the polarizing beam splitter 160. The pulses are reflected by the polarizing beam splitter 160 and travel through optical fiber 180 to an optical amplifier 150. The pulses produced by the optical amplifier 150 are processed in the same manner as pulses produced by the optical amplifier 150 in the optoelectronic A–D converter system shown in FIG. 4.

Although the invention has been described in detail with respect to preferred embodiments thereof, it will be apparent to those skilled in the art that variations and modifications can be effected in these embodiments without departing from the spirit and scope of the invention.

I claim:

1. An analog-to-digital converter system comprising:
    a pulsed laser source for producing laser pulses which have a predetermined wavelength band, which have a pulse duration shorter than picoseconds and which define an inter-pulse period therebetween;
    an optical pulse processing means for one-to-one mapping of spectral components of said wavelength band onto time components over said inter-pulse period so as to thereby create a quasi-continuous optical carrier;
    an electro-optical modulator for modulating said optical carrier with a radio frequency input signal so as to produce an amplitude modulated optical output signal;
    a wavelength division demultiplexer, having an input and a plurality of outputs, for receiving said modulated optical output signal at said input and for separating, based on wavelength, said modulated optical output signal into a plurality of separate channels at said outputs so as to produce a like plurality of separated signals;
    a like plurality of photodetectors, each connected to one of said outputs, for converting said separated signals into a like plurality of analog electrical signals; and
    a like plurality of analog to digital converters for converting said analog electrical signals into digital signals.

2. A system as claimed in claim 1 wherein said optical pulse processing means comprises a highly dispersive optical fiber link connected between said laser source and said modulator.

3. A system as claimed in claim 2 wherein said highly dispersive optical fiber link maps said spectral components of said wavelength band into continuous time components over said inter-pulse period such that the optical power of said quasi-continuous optical carrier is substantially constant during each inter-pulse period.

4. A system as claimed in claim 1 further comprising an optical amplifier coupled between said laser source and said electro-optical modulator at the input of said electro-optical modulator.

5. A system as claimed in claim 1 further comprising trigger means associated with said laser source for controlling triggering of said analog-to-digital converters.

6. An analog-to-digital converter system comprising:

a pulsed laser source for producing laser pulses which have a predetermined wavelength band, which have a pulse duration shorter than picoseconds and which define an inter-pulse period therebetween;

an optical pulse processing means for converting each of said pulses into a series of narrower bandwidth pulses having different wavelength bands;

an electro-optical modulator for modulating said narrower bandwidth pulses with a radio frequency input signal so as to produce a series of amplitude modulated optical output signals;

a wavelength division demultiplexer, having an input and a plurality of outputs, for receiving said series of modulated optical output signals at said input and for separating, based on wavelength, said modulated optical output signal into a plurality of separate channels at said outputs so as to produce a like plurality of separated signals;

a like plurality of photodetectors, each connected to one of said outputs, for converting said modulated optical output signals into a like plurality of analog electrical signals; and a like plurality of analog to digital converters for converting said analog electrical signals into digital signals.

7. A system as claimed in claim 6 wherein said pulse processing means comprises:

a wavelength demultiplexer having an input for receiving said pulses and a plurality of outputs; a plurality of optical fiber links each connected to one of said outputs of said demultiplexer, said optical fiber links being of different lengths; and a multiplexer having a plurality of inputs each connected to one of said optical fiber links and an output connected to said electro-optical modulator.

8. A system as claimed in claim 6 wherein said pulse processing means comprises:

a beam splitter having an input terminal connected to an output of said laser source, an output/input terminal and an output terminal connected to said electro-optical modulator;

a wavelength demultiplexer having an input/output terminal connected to said output/input terminal of said beam splitter and a plurality of outputs;

a plurality of optical fiber links connected between respective outputs of said demultiplexer and a plurality of Faraday rotator mirrors; and wherein said plurality of Faraday rotator mirrors rotate and reflect signals received thereby, said optical fiber links being of different lengths, and signals rotated and reflected by said Faraday rotator mirrors being returned to said beam splitter through said wavelength demultiplexer and outputted at said output terminal of said beam splitter to said electro-optical modulator.

9. A system as claimed in claim 6 further comprising noise reducer means connected to said electro-optical modulator for adjusting a bias voltage of said electro-optical modulator based on optical power changes of said narrower bandwidth pulses.

10. A system as claimed in claim 6 further comprising an optical amplifier coupled between said laser source and said electro-optical modulator at the input of said electro-optical modulator.

11. A system as claimed in claim 6 further comprising trigger means associated with said laser source for controlling triggering of said analog-to-digital converters.

* * * * *